(12) United States Patent
Zhou et al.

(10) Patent No.: US 8,871,897 B2
(45) Date of Patent: Oct. 28, 2014

(54) AMINE-CONTAINING DIFLUORO BENZOTRIAZOLYL POLYMER, PREPARATION METHOD AND USE THEREOF

(75) Inventors: Mingjie Zhou, Guangdong (CN); Ping Wang, Guangdong (CN); Zhenhua Zhang, Guangdong (CN); Hui Huang, Guangdong (CN)

(73) Assignee: Ocean's King Lighting Science & Technology Co., Ltd., Guangdong (CN)

( * ) Notice: Subject to any disclaimer, the term of this patent is extended or adjusted under 35 U.S.C. 154(b) by 0 days.

(21) Appl. No.: 14/128,707

(22) PCT Filed: Sep. 23, 2011

(86) PCT No.: PCT/CN2011/080127
§ 371 (c)(1),
(2), (4) Date: Dec. 23, 2013

(87) PCT Pub. No.: WO2013/040794
PCT Pub. Date: Mar. 28, 2013

(65) Prior Publication Data
US 2014/0128558 A1    May 8, 2014

(51) Int. Cl.
*C08G 75/00* (2006.01)
*H01L 51/00* (2006.01)
*C08G 61/12* (2006.01)
*H01L 51/42* (2006.01)

(52) U.S. Cl.
CPC ......... *H01L 51/0043* (2013.01); *H01L 51/4253* (2013.01); *C08G 2261/944* (2013.01); *C08G 2261/91* (2013.01); *H01L 51/0036* (2013.01); *C08G 2261/146* (2013.01); *C08G 61/12* (2013.01); *C08G 2261/364* (2013.01); *C08G 2261/3241* (2013.01); *C08G 61/126* (2013.01); *C08G 2261/3223* (2013.01); *C08G 2261/3227* (2013.01); *C08G 2261/3162* (2013.01); *H01L 51/0047* (2013.01); *C08G 2261/1424* (2013.01); *H01L 51/0035* (2013.01); *C08G 2261/413* (2013.01); *C08G 61/123* (2013.01)
USPC .......................... 528/377; 528/378; 528/380

(58) Field of Classification Search
USPC .......................... 528/377, 378, 380
See application file for complete search history.

*Primary Examiner* — Shane Fang
(74) *Attorney, Agent, or Firm* — Rosenberg, Klein & Lee

(57) ABSTRACT

An amine-containing difluoro benzotriazolyl polymer, preparation method, and use thereof are provided; the polymer has a structure as represented by formula (I),

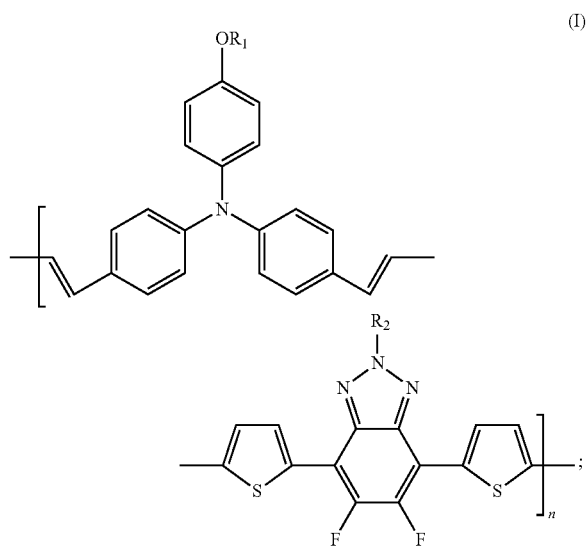

both $R_1$ and $R_2$ are alkyls from $C_1$ to $C_{20}$, n is an integer from 10 to 50. In the polymer of the present disclosure, because the 1,2,3-benzotriazole solar cell material contains two fluorine atoms, the HOMO energy level is reduced by 0.11 eV, the fluorine-substituted 1,2,3-benzotriazole has two imido groups with strong electron-withdrawing property; the 1,2,3-benzotriazole is a heterocyclic compound with strong electron-withdrawing property, and an alkyl chain can be easily introduced to the N-position of the N—H bond of the benzotriazole; the functional group of the alkyl chain can improve solar energy conversion efficiency, thus solving the low efficiency problem of the solar cell made from the solar cell material.

9 Claims, 3 Drawing Sheets

AMINE-CONTAINING DIFLUORO BENZOTRIAZOLYL POLYMER, PREPARATION METHOD AND USE THEREOF

FIELD OF THE INVENTION

The present disclosure relates to the field of solar cell material, more particularly relates to an amine-containing difluoro benzotriazolyl polymer, preparation method and use thereof.

BACKGROUND OF THE INVENTION

The preparation of solar cell using the materials with low cost and high performance has been a research hotspot and difficulty of the photovoltaic field. At present, the application of silicon cells used on the ground is limited mainly because of the complex production process and the high cost. In order to reduce the cost of the cell and expand its application range, a new solar cell material has been sought for a long time. The organic semiconductor material has gained lots of concern due to the advantages of readily accessible raw material, inexpensive, simple preparation process, good environmental stability and photovoltaic effect and so on. Since N. S. Sariciftci et al reported the phenomenon of photoinduced electron transferring between conjugated organic semiconductor materials and $C_{60}$ on the SCIENCE in 1992 (N. S Sariciftci, L. Smilowitz, A. J. Heeger, et al. Science, 1992, 258, 1474), numerous researches have been invested into the polymer solar cell. Although it has been rapidly developed, the conversion efficiency of the polymer solar cell is still much lower than that of the inorganic solar cell.

SUMMARY OF THE INVENTION

The present disclosure is directed to an amine-containing difluoro benzotriazolyl polymer having a high energy conversion efficiency.

An amine-containing difluoro benzotriazolyl polymer is represented by the structural formula (I):

(I)

Wherein both $R_1$ and $R_2$ represent $C_1$ to $C_{20}$ alkyl, n is an integer from 10 to 50, preferably, n ranges from 30 to 40.

The present disclosure is also directed to a method of preparing an amine-containing difluoro benzotriazolyl polymer, which includes the steps of:

Step S1, providing compounds A and B represented by the following structural formulas, respectively:

A

B wherein $R_1$ in the compound A represents $C_1$ to $C_{20}$ alkyl, $R_2$ in the compound B represents $C_1$ to $C_{20}$ alkyl;

Step S2, in an oxygen-free environment, adding the compound A and the compound B to an organic solvent containing a catalyst according to a molar ratio of 1:1, performing a Heck coupling reaction for 24 to 96 hours at a temperature from 70° C. to 130° C., then obtaining the amine-containing difluoro benzotriazolyl polymer with the following structural formula (I):

(I)

n is an integer from 10 to 50.

The method of preparing the amine-containing difluoro benzotriazolyl polymer further includes step of:

Step S3, purifying the amine-containing difluoro benzotriazolyl polymer obtained from the step S2.

In the step S2 of the method of preparing the amine-containing difluoro benzotriazolyl polymer, the catalyst is organic palladium, or the catalyst is a mixture of organic palladium and organic phosphorus ligand. A molar ratio between the organic palladium and the compound A is 1:20 to 1:100. The organic palladium is at least one selected from the group consisting of bis(triphenylphosphine) palladium(II) dichloride, tetrakis(triphenylphosphine)platinum, and palladium acetate. The organic phosphorus ligand is tri-o-tolyl phosphine.

The organic solvent is at least one selected from the group consisting of toluene, N,N-dimethylformamide, and tetrahydrofuran.

Preferably, in the step S2, a reaction temperature of the Heck coupling reaction is 90° C. to 120° C., a reaction time of the Heck coupling reaction is 48 to 72 hours.

The present disclosure is directed to a use of the amine-containing difluoro benzotriazolyl polymer in an organic solar cell.

In the amine-containing difluoro benzotriazolyl polymer of the present disclosure, because the 1,2,3-benzotriazole solar cell material contains two fluorine atoms, the HOMO energy level is reduced by 0.11 eV. The fluorine-substituted 1,2,3-benzotriazole has two imido groups with strong electron-withdrawing property; the 1,2,3-benzotriazole is a heterocyclic compound with strong electron-withdrawing property, and an alkyl chain can be easily introduced to the N-position of the N—H bond of the benzotriazole; the functional group of the alkyl chain can improve solar energy conversion efficiency, thus solving the low efficiency problem of the solar cell made from the solar cell material. Moreover, the functional group of the alkyl chain can regulate the solubility of the amine-containing difluoro benzotriazolyl polymer, so that the solar cell material is conducive to film forming processing, and its application range in the field of solar cell made from the solar cell material is expanded.

DETAILED DESCRIPTION OF THE EMBODIMENTS

An amine-containing difluoro benzotriazolyl polymer of the present disclosure is represented by the structural formula (I):

(I)

Where both $R_1$ and $R_2$ represent $C_1$ to $C_{20}$ alkyl, n is an integer from 10 to 50, preferably, n ranges from 30 to 40.

Figure 1:
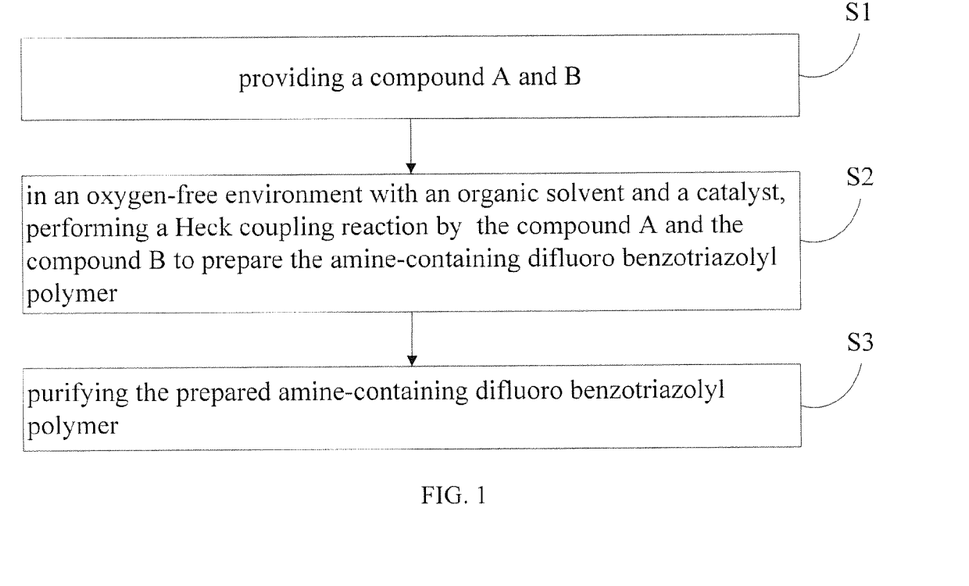
FIG. 1 is a flow chart of the method of preparing an amine-containing difluoro benzotriazolyl polymer of the present disclosure.

Referring to FIG. 1, a method of preparing the amine-containing difluoro benzotriazolyl polymer includes the steps of:

Step S1, compounds A and B represented by the following structural formulas are provided, respectively;

i.e. 4,4'-divinyl-p-alkoxy phenyl diphenylamine;

i.e. 2-alkyl-4,7-bis(5-bromo-thienyl)-5,6-difluoro-1,2,3-benzotriazole;

$R_1$ in the compound A represents $C_1$ to $C_{20}$ alkyl; $R_2$ in the compound B represents $C_1$ to $C_{20}$ alkyl.

Step S2, in an oxygen-free environment (for example, the oxygen-free environment composed of nitrogen, argon, or a mixture gas of nitrogen and argon, etc.), the compound A and the compound B are added to an organic solvent containing a catalyst according to a molar ratio of 1:1, a Heck coupling reaction is performed for 24 to 96 hours at a temperature from 70° C. to 130° C., a reaction solution containing the product, i.e. the amine-containing difluoro benzotriazolyl polymer represented by the following structural formula (I), is obtained:

(I)

Where n is an integer from 10 to 50.

Step S3, the product obtained from the step S2 is purified:

Methanol is added to the reaction solution of the step S2, the reaction solution is precipitated to obtain a sediment. The sediment is extracted by a Soxhlet extractor after filtering, and then the sediment is extracted successively with methanol and n-hexane extraction for 24 hours. Then, the sediment is extracted by using chloroform as a solvent until the reaction solution is colorless. A chloroform solution is collected and rotary evaporated to obtain a red powder, the red powder is dried under vacuum at a temperature of 50° C. for 24 hours to obtain a purified amine-containing difluoro benzotriazolyl polymer.

In the step S2 of the method of preparing the amine-containing difluoro benzotriazolyl polymer, the catalyst is organic palladium, or the catalyst is a mixture of organic palladium and organic phosphorus ligand. A molar ratio between the organic palladium and the compound A is 1:20 to 1:100. The organic palladium is at least one selected from the group consisting of bis(triphenylphosphine) palladium(II) dichloride, tetrakis(triphenylphosphine)platinum, and palladium acetate. The organic phosphorus ligand is tri-o-tolyl phosphine. In the mixture of organic palladium and organic phosphorus ligand, a molar ratio between the organic palladium and the organic phosphorus ligand is 1:3 to 1:6.

The organic solvent is at least one selected from the group consisting of toluene, N,N-dimethylformamide, and tetrahydrofuran.

Preferably, in the step S2, a reaction temperature of the Heck coupling reaction is 90° C. to 120° C. A reaction time of the Heck coupling reaction is 48 to 72 hours.

In the amine-containing difluoro benzotriazolyl polymer of the present disclosure, because the 1,2,3-benzotriazole solar cell material contains two fluorine atoms, the HOMO energy level is reduced by 0.11 eV. The fluorine-substituted 1,2,3-benzotriazole has two imido groups with strong electron-withdrawing property; the 1,2,3-benzotriazole is a heterocyclic compound with strong electron-withdrawing property, and an alkyl chain can be easily introduced to the N-position of the N—H bond of the benzotriazole; the functional group of the alkyl chain can improve solar energy conversion efficiency, thus solving the low efficiency problem of the solar cell made from the solar cell material. Moreover, the functional group of the alkyl chain can regulate the solubility of the amine-containing difluoro benzotriazolyl polymer, so that the solar cell material is conducive to film forming processing, and its application range in the solar cell material or in the field of solar cell is expanded.

Furthermore, the preparation method of the present disclosure employs a relatively simple synthetic route, thereby simplifying process; the manufacturing cost is reduced due to the inexpensive and readily available materials.

The foregoing amine-containing difluoro benzotriazolyl polymer can be applied to an active layer of an organic solar cell.

For a better understanding of the present disclosure, the technical solution of the present disclosure is further illustrated by the specific examples and drawings, which includes the materials preparation and device fabrication. However, the specific examples are not intended to limit the scope of the present disclosure. The monomer of the compound A can be purchased from the market, the monomer of the compound B can be prepared according to the reference (*J. Am. Chem. Soc.* 2011, 133, 4625) or purchased from the market.

Example 1

An amine-containing difluoro benzotriazolyl polymer of this example is poly {4,4'-divinyl-p-n-octyloxyphenyl diphenylamine-co-2-n-octyl-4,7-dithienyl-5,6-difluoro benzotriazole}, where $R_1$ is n-octyl, $R_2$ is n-octyl, n is 37. The polymer has the following structural formula:

The preparation of the solar cell material includes the steps of:

The reaction is shown as follows:

4,4'-divinyl-p-n-octyloxyphenyl diphenylamine (89 mg, 0.3 mmol), 2-n-octyl-4,7-bis(5-bromo-thienyl)-5,6-difluoro-1,2,3-benzotriazole (176.8 mg, 0.3 mmol), palladium acetate (10.1 mg, 0.015 mmol), and tri-o-methoxy phosphorus (3 mg) were added to a flask containing 12 mL of N,N-dimethylformamide and were dissolved to form a solution. After nitrogen was sufficiently introduced to the flask to exhaust the air for 30 min, a Heck coupling reaction was performed for 48 hours at a temperature of 120° C. in the condition of stirring, the polymerization reaction was stopped after cooling, and a reaction solution was obtained.

40 mL of methanol was added to flask, the reaction solution was precipitated to obtain a sediment. Then, the sediment was extracted by a Soxhlet extractor after filtering, and then the sediment was extracted successively with methanol and n-hexane extraction for 24 hours. The sediment was extracted by using chloroform as a solvent until the reaction solution was colorless. A chloroform solution was collected and rotary evaporated to obtain a red powder, and finally the red powder was dried under vacuum at a temperature of 50° C. for 24 hours to obtain a product, i.e. poly {4,4'-divinyl-p-n-octyloxyphenyl diphenylamine-co-2-n-octyl-4,7-dithienyl-5,6-difluoro benzotriazole} with a yield of 58%.

Test results: Molecular weight (GPC, THF, R. I): $M_n$=31.6 kDa, $M_w/M_n$=2.2.

Example 2

An amine-containing difluoro benzotriazolyl polymer of this example is poly {4,4'-divinyl-p-methoxyphenyl diphenylamine-co-2-n-eicosyl-4,7-di-thienyl-5,6-difluoro benzotriazole}, where $R_1$ is methyl, $R_2$ is n-eicosyl, n is 30. The polymer has the following structural formula:

The preparation of the solar cell material includes steps of:
The reaction is shown as follows:

4,4'-divinyl-p-methoxyphenyl diphenylamine (65 mg, 0.2 mmol) and 2-n-eicosyl-4,7-bis(5-bromo thienyl)-5,6-difluoro-1,2,3-benzotriazole (151.4 mg, 0.2 mmol) were added to a flask containing 15 mL of toluene and were dissolved to form a solution. The flask was evacuated to remove the oxygen and the nitrogen was introduced to the flask. After 5 mg bis(triphenylphosphine) palladium(II) dichloride was added, a Heck coupling reaction was performed for 60 hours at a temperature of 100° C. in the condition of stirring, the polymerization reaction was stopped after cooling, and a reaction solution was obtained.

50 mL of methanol was added to the flask, the reaction solution was precipitated to obtain a sediment. Then, the sediment was extracted by a Soxhlet extractor after filtering, and then the sediment was extracted successively with methanol and n-hexane extraction for 24 hours. The sediment was extracted by using chloroform as a solvent until the reaction solution was colorless. A chloroform solution was collected and rotary evaporated to obtain a red powder, and finally the red powder was dried under vacuum at a temperature of 50° C. for 24 hours to obtain a product, i.e. poly {4,4'-divinyl-p-methoxyphenyl diphenylamine-co-2-n-eicosyl-4,7-di-thienyl-5,6-difluoro benzotriazole} with a yield of 52%.

Test results: Molecular weight (GPC, THF, R. I): $M_n$=28.6 kDa, $M_w/M_n$=2.2.

Figure 2:
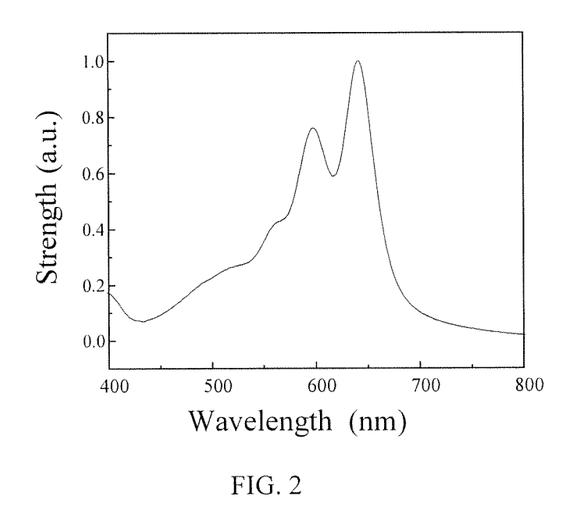
FIG. 2 is an ultraviolet visible absorption spectrum of poly{4,4'-divinyl-p-methoxyphenyl diphenylamine-co-2-n-eicosyl-4,7-dithienyl-5,6-difluoro benzotriazole} prepared according to example 2.

The FIG. 2 shows an ultraviolet visible absorption spectrum of poly {4,4'-divinyl p-methoxyphenyl diphenylamine-co-2-n-eicosyl-4,7-di-thienyl-5,6-difluoro benzotriazole} of the example 2, it can be seen from the FIG. 2 that the conjugated polymer has a strong absorption peak at about 640 nm.

Example 3

An amine-containing difluoro benzotriazolyl polymer of this example is poly {4,4'-divinyl-p-n-eicosyloxyphenyl diphenylamine-co-2-methyl-4,7-dithienyl-5,6-difluoro benzotriazole}, $R_1$ is n-eicosyl, $R_2$ is methyl, n is 40. The polymer has the following structural formula:

The preparation of the solar cell material includes steps of:
The reaction is shown as follows:

4,4'-divinyl-p-n-eicosyloxyphenyl diphenylamine (178 mg, 0.3 mmol) and 2-methyl-4,7-bis(5-bromo thienyl)-5,6-difluoro-1,2,3-benzotriazole (147.3 mg, 0.3 mmol) were added to a 50 mL of 2-necked flask containing 15 mL of tetrahydrofuran and were dissolved to form a solution. After a mixed gas of nitrogen and argon was sufficiently introduced to the 2-necked flask to exhaust the air for 20 min, 17 mg tetrakis(triphenylphosphine) platinum was added to the 2-necked flask. After a mixed gas of nitrogen and argon was sufficiently introduced to the 2-necked flask to exhaust the air for 10 min, a Heck coupling reaction was performed for 72 hours at a temperature of 90° C. in the condition of stirring, a reaction solution was obtained.

40 mL of methanol was added to the flask, the reaction solution was precipitated to obtain a sediment. Then, the sediment was extracted by a Soxhlet extractor after filtering, and then the sediment was extracted successively with methanol and n-hexane extraction for 24 hours. The sediment was extracted by using chloroform as a solvent until the reaction solution was colorless. A chloroform solution was collected and rotary evaporated to obtain a red powder, and finally the red powder was dried under vacuum at a temperature of 50° C. for 24 hours to obtain a product, i.e. poly {4,4'-divinyl-p-n-eicosyl oxyphenyl diphenylamine-co-2-methyl-4,7-dithienyl-5,6-difluoro benzotriazole} with a yield of 50%.

Test results: Molecular weight (GPC, THF, R. I): $M_n$=37.0 kDa, $M_w/M_n$=2.2.

Example 4

An amine-containing difluoro benzotriazolyl polymer of this example is poly {4,4'-divinyl-p-n-hexyloxy-phenyl diphenylamine-co-2-n-hexadecyl-4,7-dithienyl-5,6-difluoro benzotriazole}, $R_1$ is n-hexyl, $R_2$ is n-hexadecyl, n is 10. The polymer has the following structural formula:

The preparation of the solar cell material includes steps of:
The reaction is shown as follows:

4,4'-divinyl-p-n-hexyloxy-phenyl diphenylamine (79.4 mg, 0.2 mmol) and 2-n-hexadecyl-4 7-bis(5-bromo-thienyl)-5,6-difluoro-1,2,3-benzotriazole (140 mg, 0.2 mmol) were added to a flask containing 15 mL of toluene and were dissolved to form a solution. After the flask was evacuated to remove the oxygen and the nitrogen was sufficiently introduced to the flask, bis(triphenylphosphine) palladium(II) dichloride (0.01 mmol, 7.02 mg) was added, and a Heck coupling reaction was performed for 24 hours at a temperature of 130° C. in the condition of stirring, the polymerization reaction was stopped after cooling, and a reaction solution was obtained.

50 mL of methanol was added to the flask, the reaction solution was precipitated to obtain a sediment. Then, the sediment was extracted by a Soxhlet extractor after filtering, and then the sediment was extracted successively with methanol and n-hexane extraction for 24 hours. The sediment was extracted by using chloroform as a solvent until the reaction solution was colorless. A chloroform solution was collected and rotary evaporated to obtain a red powder, and finally the red powder was dried under vacuum at a temperature of 50° C. for 24 hours to obtain a product, i.e. poly {4,4'-divinyl-p-n-hexyloxy-phenyl diphenylamine-co-2-n-hexadecyl-4,7-dithienyl-5,6-difluoro benzotriazole} with a yield of 45%.

Test results: Molecular weight (GPC, THF, R. I): $M_n$=11.4 kDa, $M_w/M_n$=2.3.

Example 5

An amine-containing difluoro benzotriazolyl polymer of this example is poly {4,4'-divinyl-p-n-butoxy-phenyl diphenylamine-co-2-n-tetradecyl-4,7-dithienyl-5,6-difluoro benzotriazole}, $R_1$ is n-butyl, $R_2$ is n-tetradecyl, n is 50. The polymer has the following structural formula:

The preparation of the solar cell material includes steps of:
The reaction is shown as follows:

n-butoxy-phenyl diphenylamine-co-2-n-tetradecyl-4,7-dithienyl-5,6-difluoro benzotriazole} with a yield of 72%.

4,4'-divinyl-p-n-butoxy-phenyl diphenylamine (111 mg, 0.3 mmol) and 2-n-tetradecyl-4,7-dithienyl-5,6-difluoro benzotriazole (202 mg, 0.3 mmol) were added to a 50 mL of 2-necked flask containing 15 mL of tetrahydrofuran and were dissolved to form a solution. After a mixed gas of nitrogen and argon was sufficiently introduced to the 2-necked flask to exhaust the air for 20 min, tetrakis(triphenylphosphine)palladium (0.003 mmol, 3.7 mg) was added to the 2-necked flask. After a mixed gas of nitrogen and argon was sufficiently introduced to the 2-necked flask to exhaust the air for 10 min, a Heck coupling reaction was performed for 96 hours at a temperature of 70° C. in the condition of stirring, and a reaction solution is obtained.

40 mL of methanol was added to the flask, the reaction solution was precipitated to obtain a sediment. Then, the sediment was extracted by a Soxhlet extractor after filtering, and then the sediment was extracted successively with methanol and n-hexane extraction for 24 hours. The sediment was extracted by using chloroform as a solvent until the reaction solution was colorless. A chloroform solution was collected and rotary evaporated to obtain a red powder, and finally the red powder was dried under vacuum at a temperature of 50° C. for 24 hours to obtain a product, i.e. poly {4,4'-divinyl-p-

Test results: Molecular weight (GPC, THF, R. I): $M_n$=44.0 kDa, $M_w/M_n$=2.0.

Example 6

An organic solar cell device of the example 6 was prepared using the poly {4,4'-divinyl-p-methoxyphenyl diphenylamine-co-2-n-eicosyl-4,7-di-thienyl-5,6-difluoro benzotriazole} (i.e. DFBTz-TPA2) of Example 2 as an electron donor material of an active layer.

Figure 3:
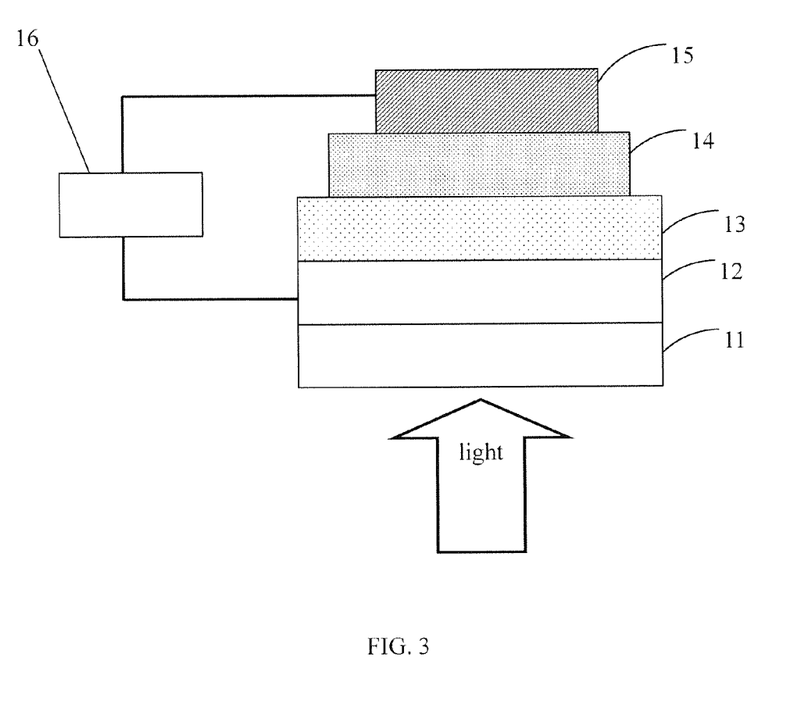
FIG. 3 is a schematic structure view of the organic solar cell according to example 4.

Referring to FIG. 3, the organic solar cell device includes a glass 11, a transparent anode 12, an intermediate auxiliary layer 13, an active layer 14, and a cathode 15, which are sequentially laminated. The transparent anode 12 can be made of indium tin oxide (abbreviation as ITO), preferably the indium tin oxide with a sheet resistance of 10-20 Ω/sq. The intermediate auxiliary layer 13 is made of a composite of poly 3,4-ethylenedioxythiophene and poly styrene sulfonate (abbreviation as PEDOT:PSS). The active layer 14 includes an electron donor material and an electron acceptor material. The electron donor material is the polymer obtained from the example 1 (i.e. DFBTz-TPA2). The electron acceptor material can be [6,6]-phenyl-$C_{61}$-butyric acid methyl ester (abbreviation as PCBM). The cathode 15 can be an aluminum electrode or a double-layer metal electrode, such as Ca/Al or Ba/Al and so on, the thicknesses of the cathode 15 is preferably 170 nm, 30 mm, 130 nm, or 60 nm.

In fabrication, the glass layer was used as a bottom layer, the ITO glass was cleaned by ultrasonic and treated with an oxygen-Plasma, and then the ITO glass was spin-coated with the intermediate auxiliary layer 13, then the polymer obtained from Example 1 and the electron acceptor material were mixed and coated on the intermediate auxiliary layer 13 to form the active layer 14, and then the cathode 15 was deposited on the active layer 14 by vacuum deposition techniques, the organic solar cell device was thus obtained. The organic solar cell was then heated at 110° C. for 4 hours in a sealed condition, and cooled to room temperature. The anneal of the device can effectively increase the arranged orderliness and regularity of each group in the molecule and the molecular chain segments, and the carrier mobility and the efficiency of the transmission speed were improved, thereby improving the photoelectric conversion efficiency. In the illustrated embodiment, the thickness of the Al layer of the cathode 15 was 170 nm.

Referring to the FIG. 3, under illumination, the light is transmitted through the glass substrate 11 and the ITO electrode 12, then the light energy is absorbed by the hole-conduction type electroluminescent material of the active layer 14, and excitons are generated, the excitons migrate to the interface between the electron donor and acceptor materials, and the electrons are transferred to the electron acceptor material, such as PCBM, the charges are separated, thereby forming the free carriers, i.e. the free electrons and the holes. The free electrons are transferred to the cathode along the electron acceptor material and collected by the cathode, thereby forming the photocurrent and photovoltage, and implementing photoelectric conversion. When a load 16 is connected, the device is capable of supplying power. Since the hole-conduction type electroluminescent material has a wide spectral response range, the light energy is fully utilized to gain much higher photoelectric conversion efficiency, and the power generation capacity of the organic solar cell is increased. Moreover, this type of organic material is also capable of reducing the weight of the organic solar cell; and it can be made by spin coating technology for mass production.

The photovoltaic properties of the organic solar cell of Example 6 are shown in the Table 1 (Note: PCE represents the power conversion efficiency, $V_{oc}$ represents the open circuit voltage, $J_{sc}$ represents the short circuit current, FF represents the fill factor.)

TABLE 1

| | $V_{oc}$ (V) | $J_{sc}$ (mA/cm$^2$) | FF (%) | PCE (%) |
|---|---|---|---|---|
| DFBTz-TPA2/PCBM | 0.62 | 8.50 | 52.7 | 2.8 |

It can be seen from Table 1 that, under the AM1.5, 100 mW/cm$^2$ illumination, the energy conversion efficiency of the bulk-heterojunction solar cell based on the DFBTz-TPA2 as the electron donor material is 2.8%, where AM means the air mass, which is represented by the ratio between the optical path-length of solar beam through the atmosphere relative to the optical path-length of the solar beam at zenith reaching to the sea level. The AM 1.5 condition means the irradiance and spectral distribution for calibrating and testing the terrestrial solar cell. The total solar irradiance is 1000 Watts per square meter, the measured temperature of the solar cell is 25° C. The standard is enacted by the International Electrotechnical Commission, which is the currently standard in our country. Specifically, one standard solar corresponds to the irradiation strength of the AM1.5G standard light source, AM1.5G represents the sunlight with a 480 zenith angle (the angle between the incident light from the incident light source and the normal of the earth); the light intensity is 1000 W/m$^2$ (i.e. AM1.5, 100 mW/cm$^2$ illumination).

It should be understood that the preferred specific embodiments are specific and detailed, and should not be interpreted as limitations to the scope of the invention, as defined by the appended claims.

What is claimed is:

1. An amine-containing difluoro benzotriazolyl polymer, having a structural formula (I):

wherein both $R_1$ and $R_2$ represent $C_1$ to $C_{20}$ alkyl, n is an integer from 10 to 50.

2. The amine-containing difluoro benzotriazolyl polymer according to claim 1, wherein n ranges from 30 to 40.

3. A method of preparing an amine-containing difluoro benzotriazolyl polymer, comprising the steps of:

step S1, providing compounds A and B represented by the following structural formulas:

wherein $R_1$ in the compound A represents $C_1$ to $C_{20}$ alkyl, $R_2$ in the compound B represents $C_1$ to $C_{20}$ alkyl; and step S2, in an oxygen-free environment, adding the compound A and the compound B to an organic solvent containing a catalyst according to a molar ratio of 1:1, performing a Heck coupling reaction for 24 to 96 hours at a temperature from 70° C. to 130° C., then obtaining the amine-containing difluoro benzotriazolyl polymer with the following structural formula (I):

(I)

wherein n is an integer from 10 to 50.

4. The method according to claim 3, further comprising step of: step S3, purifying the amine-containing difluoro benzotriazolyl polymer obtained from the step S2.

5. The method according to claim 3, wherein the catalyst in the step S2 is organic palladium, or the catalyst is a mixture of organic palladium and organic phosphorus ligand.

6. The method according to claim 5, wherein the organic palladium is at least one selected from the group consisting of bis(triphenylphosphine) palladium(II) dichloride, tetrakis(triphenylphosphine)platinum, and palladium acetate; the organic phosphorus ligand is tri-o-tolyl phosphine.

7. The method according to claim 5, wherein a molar ratio between the organic palladium and the compound A is 1:20 to 1:100.

8. The method according to claim 3, wherein the organic solvent in the step S2 is at least one selected from the group consisting of toluene, N,N-dimethylformamide, and tetrahydrofuran.

9. The method according to claim 3, wherein in the step S2, a reaction temperature of the Heck coupling reaction is 90° C. to 120° C., a reaction time of the Heck coupling reaction is 48 to 72 hours.

* * * * *